(12) United States Patent
Lee et al.

(10) Patent No.: US 10,200,011 B2
(45) Date of Patent: Feb. 5, 2019

(54) CRYSTAL OSCILLATOR PACKAGE

(71) Applicant: SAMSUNG ELECTRO-MECHANICS CO., LTD., Suwon-si (KR)

(72) Inventors: Dong Woo Lee, Suwon-si (KR); Sung Wook Kim, Suwon-si (KR); Seung Mo Lim, Suwon-si (KR); Jong Pil Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 449 days.

(21) Appl. No.: 15/153,158

(22) Filed: May 12, 2016

(65) Prior Publication Data

US 2017/0005636 A1 Jan. 5, 2017

(30) Foreign Application Priority Data

Jul. 1, 2015 (KR) .................. 10-2015-0094239

(51) Int. Cl.
*H01L 41/09* (2006.01)
*H01L 41/047* (2006.01)
*H03H 9/10* (2006.01)

(52) U.S. Cl.
CPC ................. *H03H 9/1021* (2013.01)

(58) Field of Classification Search
CPC .................................... H03H 9/1021

USPC ....................... 310/348, 367, 368
See application file for complete search history.

(56) References Cited

U.S. PATENT DOCUMENTS

| 2012/0242193 | A1* | 9/2012 | Shimao | H03H 9/1021 |
| | | | | 310/348 |
| 2016/0156312 | A1* | 6/2016 | Lim | H03H 9/0509 |
| | | | | 331/158 |
| 2016/0226444 | A1* | 8/2016 | Yamashita | H03H 9/1021 |
| 2017/0070208 | A1* | 3/2017 | Lee | H03H 9/19 |
| 2017/0279431 | A1* | 9/2017 | Morimoto | H03H 9/02157 |

FOREIGN PATENT DOCUMENTS

| JP | 2004-297555 | A | | 10/2004 | |
| JP | 2011-250478 | A | | 12/2011 | |
| JP | 5049479 | B2 | | 7/2012 | |
| JP | 2013-187735 | A | | 9/2013 | |
| JP | 2015-080060 | A | * | 4/2015 | ............ H03H 9/19 |
| KR | 10-2009-0094981 | A | | 9/2009 | |

* cited by examiner

*Primary Examiner* — Thomas Dougherty
(74) *Attorney, Agent, or Firm* — NSIP Law

(57) ABSTRACT

A crystal oscillator package includes a crystal piece configured to vibrate in response to an electrical signal, a first vibrating part protruding from an upper surface of the crystal piece, a second vibrating part protruding from a lower surface of the crystal piece, a first exciting electrode disposed on the first vibrating part, a second exciting electrode disposed on the second vibrating part, and protrusions extending from an end portion of the lower surface of the crystal piece. The protrusions include two or more stages.

15 Claims, 3 Drawing Sheets

B-B'

CRYSTAL OSCILLATOR PACKAGE

CROSS-REFERENCE TO RELATED APPLICATION

This application claims the benefit under 35 USC 119(a) of Korean Patent Application No. 10-2015-0094239 filed on Jul. 1, 2015 with the Korean Intellectual Property Office, the entire disclosure of which is incorporated herein by reference for all purposes.

BACKGROUND

1. Field

The following description relates to a crystal oscillator of which reliability is improved, and a crystal oscillator package including the same.

2. Description of Related Art

A crystal oscillator is used for various applications such as a frequency oscillator, a frequency regulator, and a frequency converter. The crystal oscillator uses a crystal having excellent piezoelectric characteristics as a piezoelectric material. Here, the crystal serves as a stable mechanical vibration generator.

The crystal is artificially grown in a high pressure autoclave, is cut in relation to a crystal axis, and is processed to have desired characteristics of size and shape. Thus, the crystal is general manufactured in a wafer form.

In order to use a crystal wafer as the crystal oscillator, a crystal piece cut and processed from the crystal wafer should be fixed to an inner portion of a package, and an electrode should be formed on a surface of the crystal piece for the purpose of electrical connection.

In addition, the crystal piece fixed to the inner portion of the package may be adhered to the package by a conductive adhesive in order to be connected to external electrical elements.

In the crystal oscillator and the crystal oscillator package, when the electrode formed in the package and the crystal oscillator are adhered to each other by the conductive adhesive, adhesion between the electrode and the crystal oscillator becomes an important factor of reliability in harsh environments.

In the related art, a method of improving the adhesion by attaching an adhesive to a flat surface of an electrode pad of the crystal oscillator or forming a groove or a through-hole in the flat surface of the electrode pad has been used. However, in a method of increasing an adhesion surface area by forming the groove or the through-hole in the flat surface of the electrode pad, permeation of an adhesive was not easy due to a problem that an air film is formed in the groove or the through-hole.

Another method of improving reliability of the crystal oscillator and the crystal oscillator package has been desired.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a crystal oscillator package of which reliability is improved. The crystal oscillator package includes a crystal piece configured to vibrate in response to an electrical signal, a first vibrating part protruding from an upper surface of the crystal piece, a second vibrating part protruding from a lower surface of the crystal piece, a first exciting electrode disposed on the first vibrating part, a second exciting electrode disposed on the second vibrating part, and protrusions extending from an end portion of the lower surface of the crystal piece. The protrusions include two or more stages.

A height of the protrusions may be less than or equal to a height of the first and second vibrating parts or greater than the height of the first and second vibrating parts. The protrusions may be formed by etching the crystal piece. The protrusions may increase an adhesion area.

The crystal oscillator package my further include first and second connection electrodes electrically connected to the first and second exciting electrodes to thereby connect to an external power supply. The first and second connection electrodes may be disposed on outer surfaces of the protrusions.

In another general aspect, a crystal oscillator package includes a base substrate, a first electrode pad and second electrode pad disposed on an upper surface of the base substrate, a crystal piece configured to vibrate in response to an electrical signal, wherein an end portion of the crystal piece is fixedly attached to the first and second electrode pads, a first vibrating part protruding from an upper surface of the crystal piece, a second vibrating parts protruding from a lower surface of the crystal piece, a first exciting electrode disposed on the first vibrating part, a second exciting electrode disposed on the second vibrating part, and protrusions extending from an end portion of the lower surface of the crystal piece, wherein the protrusions comprise two or more stages.

A conductive adhesive may bond the protrusions to the first and second electrode pads. A height of the protrusions may be less than or equal to a height of the first and second vibrating parts.

The protrusions may be formed by etching the crystal piece.

First and second connection electrodes may be electrically connected to the first and second exciting electrodes to thereby connect to an external power supply, wherein the first and second connection electrodes may be disposed on outer surfaces of the protrusions.

A conductive adhesive may bond the first and second connection electrodes to the first and second electrode pads.

The protrusions may increase an adhesion area between the first and second connection electrodes and the first and second electrode pads.

Groove parts may be disposed in the first and second electrode pads corresponding to the protrusions.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
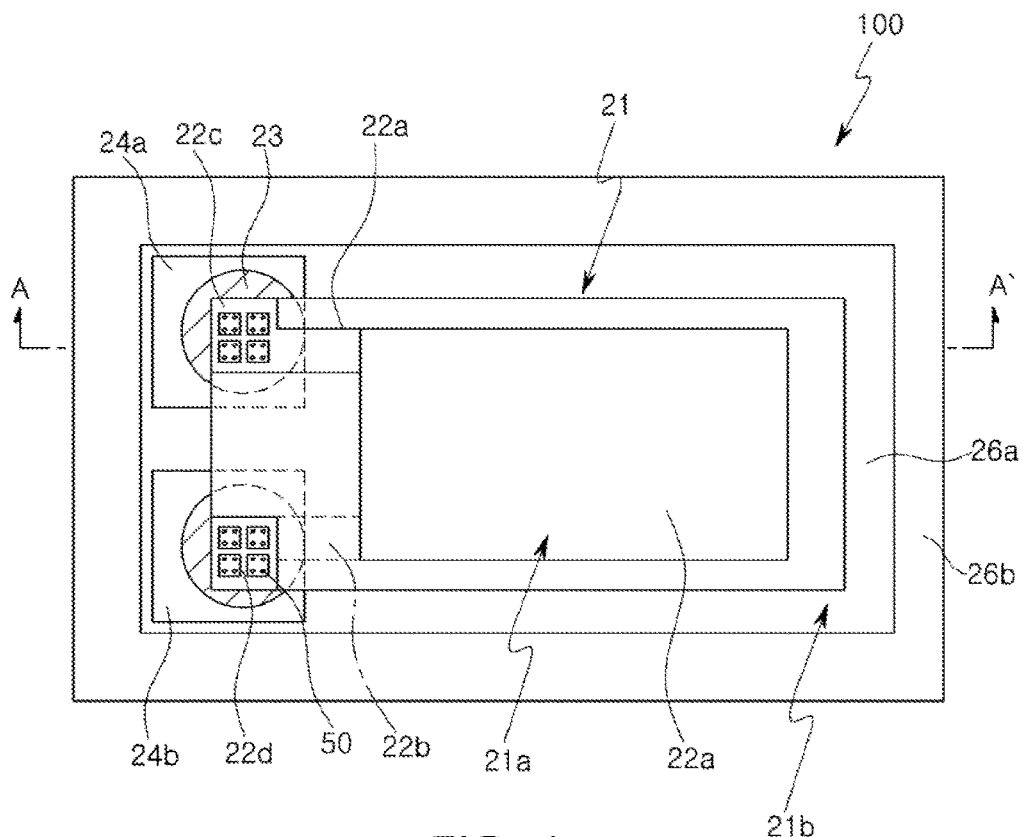
FIG. 1 is a schematic plan view of the crystal oscillator package according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

The terminology used herein is for describing particular embodiments only and is not intended to be limiting of the following description. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Figure 2:
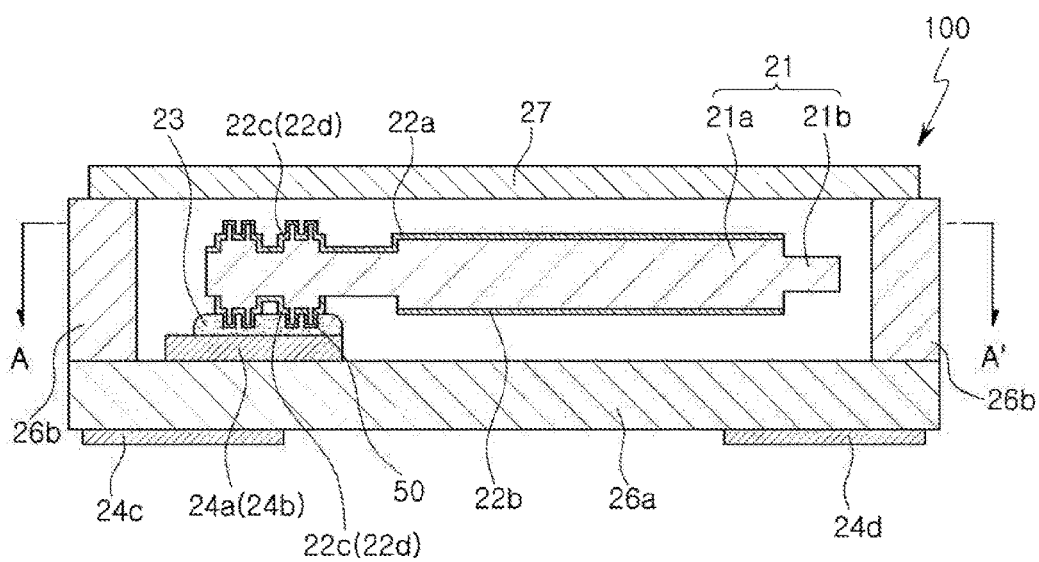
FIG. 2 is a schematic cross-sectional view of a crystal oscillator package according to an embodiment, taken along line A-A' of FIG. 1.

Referring to FIGS. 1 and 2, a crystal oscillator package 100 according to an embodiment includes a base substrate 26a on which first and second electrode pads 24a and 24b are disposed, and a crystal piece 21 having one side fixedly installed on the first and second electrode pads 24a and 24b.

In detail, the crystal oscillator package 100 includes the base substrate 26a; the first and second electrode pads 24a and 24b formed on an upper surface of the base substrate 26a; the crystal piece 21 having one side fixedly installed on the first and second electrode pads 24a and 24b and having exciting electrodes 22a and 22b formed on upper and lower surfaces thereof, respectively, to vibrate by electrical signals. The exciting electrodes 22a and 22b are electrically connected to the first and second electrode pads 24a and 24b. A support part 26b is formed along a peripheral edge of the base substrate 26a and forming an internal space accommodating the crystal piece 21 therein and a lid 27 is disposed on the support part 26b to seal the internal space. Here, the base substrate 26a, the support part 26b, and the lid 27 may be commonly called a package.

The base substrate 26a forms a bottom of the crystal oscillator package 100, and may be formed of an insulating ceramic material. For example, an aluminum oxide sintered body may be used as the base substrate 26a, formed by molding, stacking, and then sintering ceramic green sheets.

The first and second electrode pads 24a and 24b may be formed on one side of the upper surface of the base substrate 26a. In addition, the support part 26b may be formed along an edge of the base substrate 26a.

The base substrate 26a includes external electrode pads 24c and 24d formed on a lower surface thereof in order to externally receive electrical signals, wherein one of the external electrode pads 24c and 24d may be electrically connected to the first electrode pad 24a, and the other external electrode pad 24c or 24d may be electrically connected to the second electrode pad 24b. The first and second electrode pads 24a and 24b and the external electrode pads 24c and 24d may be electrically connected to each other by conductive vias, formed in the base substrate 26a. In addition, select external electrode pads 24c and 24d may be used as a ground electrode.

The first and second electrode pads 24a and 24b may also be electrically connected to the exciting electrodes 22a and 22b formed on the upper and lower surfaces of the crystal piece 21, respectively, to thereby be used as paths providing the electrical signals to the crystal piece 21. A piezoelectric effect is generated in the crystal piece 21 by the above-mentioned electrical signals. The first and second electrode pads 24a and 24b may be formed from a conductive metal, for example, gold (Au), silver (Ag), tungsten (W), copper (Cu), and molybdenum (Mo).

The support part 26b is formed along the peripheral edge of the base substrate 26a, and forms the internal space in which a crystal oscillator is accommodated, together with the base substrate 26a. The support part 26b may be formed of an insulating ceramic material, which is the same material or a different material as that of the base substrate 26a, or may be formed of a conductive metal alloy, which is the same material or a different material as that of the lid 27.

The crystal piece 21, which is a piezoelectric substrate polished to a predetermined thickness depending on an oscillation frequency, may be manufactured by cutting and processing a crystal wafer through photolithography.

The crystal piece 21 may be cut at an AT-cut, and may be excite vibrations in the thickness direction. AT-cut crystal plates have been used for crystal oscillators having main vibrations in the thickness direction, since a frequency change depending on a temperature change in room temperature is small.

When a crystal piece (or a piezoelectric vibration piece) is formed so that a thickness thereof gradually becomes thinner from a central portion thereof toward an end portion thereof, a damping amount of vibration displacement in the end portion is increased while in a thickness shear vibration mode. Thus, an effect in which vibration energy is trapped in the central portion of the piezoelectric vibration piece is increased and frequency characteristics such as a CI value, and a Q value, are improved.

Therefore, even if a thickness of the piezoelectric vibration piece is increased in order to decrease a frequency, oscillation may be efficiently performed with relatively low energy demand. Conversely, even at a relatively high frequency, a dimension of the piezoelectric vibration piece may be smaller than that of a general piezoelectric vibration piece, and thus the piezoelectric vibration piece may be miniaturized.

An example of a shape of the piezoelectric vibration piece that may accomplish a vibration energy trapping effect may include a convex shape in which a convex curved surface is formed as a main surface of the piezoelectric vibration piece, a beveled shape in which a space between a thick, flat central portion and an edge of an end portion is formed as an inclined surface, and a stepped shape in which a flat central portion is surrounded by a surrounding portion which is thinner than the central portion creating a step between the two portions. The crystal piece 21 according to an embodiment may have a stepped shape.

The crystal piece 21 may be substantially rectangular, and a stepped shape. A vibrating part 21a is disposed in a central portion of the crystal piece 21 and a surrounding part 21b is disposed along an outer edge of the vibrating part 21a. The surrounding part 21b has a thickness thinner than that of the vibrating part 21a.

In addition, the crystal piece 21 according to the stepped shape embodiment includes a thick part 21a (which is also the vibrating part), a surrounding part 21b, and the exciting electrodes 22a and 22b. The vibrating part 21a is disposed in the center of the crystal piece 21 and has a thickness greater than that of the surrounding part 21b.

Correspondingly, the surrounding part 21b may be formed in the vicinity, or along the perimeter of the vibrating part 21a and has a thickness relatively less than that of the vibrating part 21a. In other words, the crystal piece 21 includes a first vibrating part protruding from an upper surface of the crystal piece 21 as compared to the surrounding part 21b and a second vibrating part protruding from a lower surface of the crystal piece 21 as compared to the surrounding part 21b.

The exciting electrodes 22a and 22b are formed on the upper and lower surfaces of the crystal piece 21, respectively. In addition, connection electrodes 22c and 22d are connected to the exciting electrodes 22a and 22b and may be formed at one end of the crystal piece 21. For example, referring to FIGS. 1 and 2, the connection electrodes 22c and 22d are disposed on opposite sides of the top surface and bottom surfaces of one end of the crystal piece 21. The exciting electrodes 22a and 22b apply the electrical signals to the crystal piece 21 cause the crystal piece 21 to vibrate.

To this end, the exciting electrodes 22a and 22b may be formed in the same shape on both surfaces of the crystal piece 21, respectively. In one embodiment, the exciting electrodes 22a and 22b may be formed over the entire upper and lower surfaces of vibrating part 21a of the crystal piece 21, respectively. However, the exciting electrodes 22a and 22b are not limited thereto, and may be varied. For example, the exciting electrodes 22a and 22b may be formed to cover only a portion of the upper or lower surfaces of the vibrating part 21a, respectively, if desired.

The connection electrodes 22c and 22d may be connected to the exciting electrodes 22a and 22b and electrically connected to the first and second electrode pads 24a and 24b through a conductive adhesive 23. The connection electrodes 22c and 22d may be formed on upper and lower surfaces of the crystal piece 21. Referring to FIG. 2, for example, both the upper and lower surfaces of the crystal piece 21 have the same shape.

The exciting electrodes 22a and 22b and the connection electrodes 22c and 22d may be a metal coating formed by a sputtering method, a depositing method, for example, on a material such as chrome, nickel, gold, silver, or other metal. However, the exciting electrodes 22a and 22b and the connection electrodes 22c and 22d are not limited thereto.

The crystal piece 21 described above may have one side fixed within the internal space formed by the base substrate 26a and the support part 26b. For example, referring to FIG. 2 the crystal piece 21 is bonded onto the first and second electrode pads 24a and 24b by the conductive adhesive 23 so that the first and second electrode pads 24a and 24b formed on the base substrate 26a and the exciting electrodes 22a and 22b formed on the upper and lower surfaces of the crystal piece 21 are electrically connected to each other.

A plurality of protrusions 50 may be formed on an end portion of the lower surface of the crystal piece 21. For Example, the protrusions 50 are formed together with the crystal piece 21 or the vibrating part 21a of the crystal piece 21 when the crystal is etched in order to form the crystal piece 21 or the vibrating part 21a of the crystal piece 21. The connection electrodes 22c and 22d are formed on the outer surfaces of the protrusions 50 and the end portion of the lower surface of the crystal piece 21. The protrusions 50 increase a contact area between the first and second electrode pads 24a and 24b and the connection electrodes 22c and 22d when the first and second electrode pads 24a and 24b and the connection electrodes 22c and 22d are bonded to each other by the conductive adhesive 23. As an example, the exciting electrodes 22a and 22b are electrically connected to the first and second electrode pads 24a and 24b through the above-mentioned connection electrodes 22c and 22d.

The lid 27 is disposed on an upper end of the support part 26b in order to seal the internal space in which the crystal piece 21 is accommodated, thereby closing the internal space. The lid 27 is fixed and may be bonded to the support part 26b through a conductive adhesive.

Since operation efficiency and quality of the crystal oscillator are significantly affected by a change of an external environment, or pollution, it may be desirable to seal the crystal oscillator package 100 in order to protect the crystal piece 21 from an external environment and pollutants of the crystal oscillator package 100. To this end, an inner portion of the crystal oscillator package 100 may be sealed by the lid 27. In addition, the internal space of the crystal oscillator package 100 may be a vacuum, or filled with an inert gas such as nitrogen, helium, or argon, for example.

Figure 3:
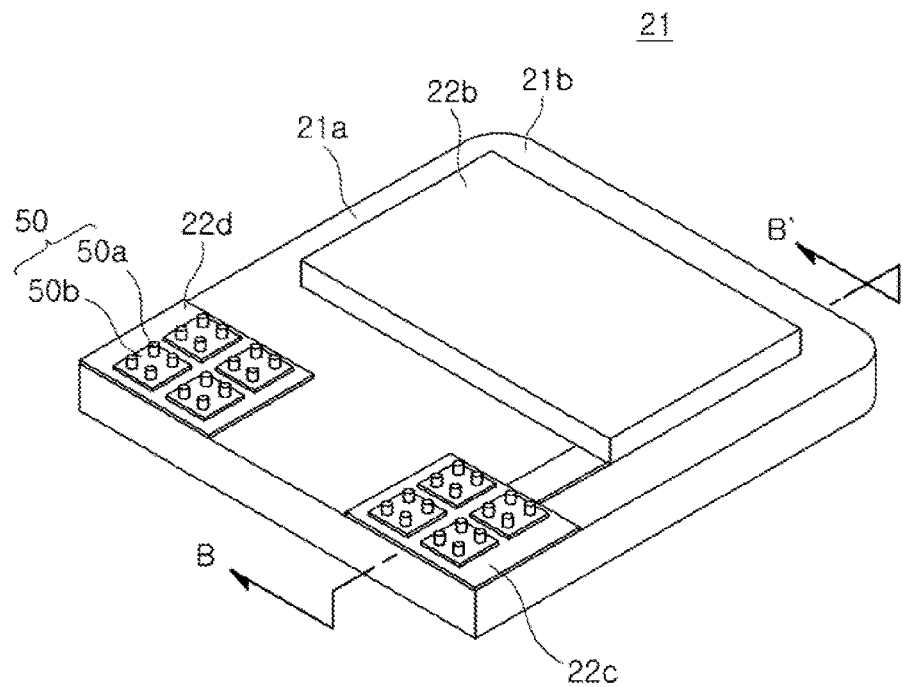
FIG. 3 is a perspective view schematically illustrating a crystal oscillator according to an embodiment.
Figure 4:
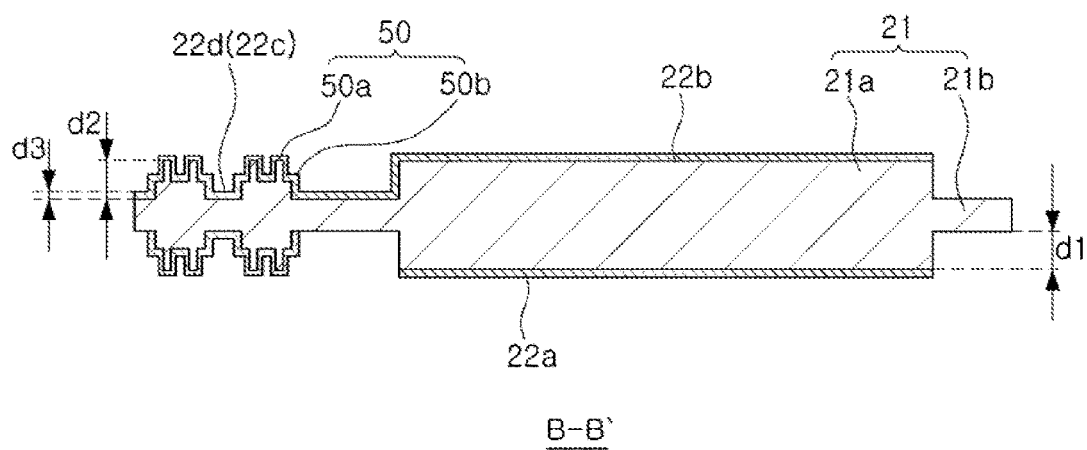
FIG. 4 is a schematic cross-sectional view taken along line B-B' of FIG. 3.

FIG. 3 is a perspective view schematically illustrating a crystal oscillator according an embodiment disposed so that the lower surface of the crystal oscillator is directed toward the top; and FIG. 4 is a schematic cross-sectional view taken along line B-B' of FIG. 3. A structure of the protrusion 50 will be described with reference to FIGS. 3 and 4.

As illustrated in FIG. 3, the plurality of protrusions 50 are formed on the end portion of the crystal piece 21. Although a case in which the protrusions 50 are formed only at portions at which the connection electrodes 22c and 22d are positioned has been disclosed in the present disclosure, the protrusions 50 are not limited thereto, and may be varied. The protrusions 50 may be formed together with the crystal piece 21 or the vibrating part 21a of the crystal piece 21 when the crystal is etched in order to form the crystal piece 21 or the vibrating part 21a of the crystal piece 21. Generally, the crystal piece 21 may be etched two times or more in order to form the vibrating part 21a, and since the protrusions 50 having two or more stages are formed together with the crystal piece 21 when the crystal piece 21 is etched, an additional process is not required. In addition, since the protrusions 50 are formed using portions of the crystal piece 21, they may have strength significantly greater than that of protrusions formed using electrodes, or the like, and thus reliability of the crystal oscillator may be improved.

Since the connection electrodes 22c and 22d are formed on the outer surfaces of the protrusions 50, the connection electrodes 22c and 22d of the crystal oscillator according to an embodiment may have a wide contact area.

Referring to FIG. 4, the protrusions 50 may have a form of two or more stages. For example, the protrusion 50 may include a second protrusion 50b having a flat shape and a first protrusion 50a extending from the second protrusion 50b and having a pillar shape. One or more first protrusions 50a may be formed on the second protrusion 50b. Since the protrusions 50 have two or more stages, an adhesion area may be significantly increased.

The protrusions 50 of the crystal oscillator according to an embodiment may have a height greater than a thickness d3 of the connection electrodes 22c and 22d formed on the surfaces of the protrusions 50. Generally, electrodes may be formed at a thickness of about 2000 Å, and the protrusions 50 according to an embodiment may be formed at a height of about 8 µm to 20 µm. Therefore, the protrusions 50 may be formed from select portions of the crystal piece 21, and thus a contact area may be significantly increased as compared with a case of forming the protrusions using electrodes.

Since the protrusions 50 are formed by etching select portions of the crystal piece 21, the protrusions 50 may have high strength while having the high height as described above. Therefore, in the crystal oscillator according to an embodiment, the crystal piece may be firmly fixed to the crystal oscillator package, and thus reliability of the crystal oscillator package may be improved.

A height d2 of the protrusions 50 may be equal to or smaller than a height d1 of the vibrating part 21a of the crystal piece 21 (see FIG. 4). A height of the second protrusion 50b may be adjusted to adjust an aspect ratio of the first protrusion 50a, thereby adjusting strength of the first protrusion 50a.

Figure 5:
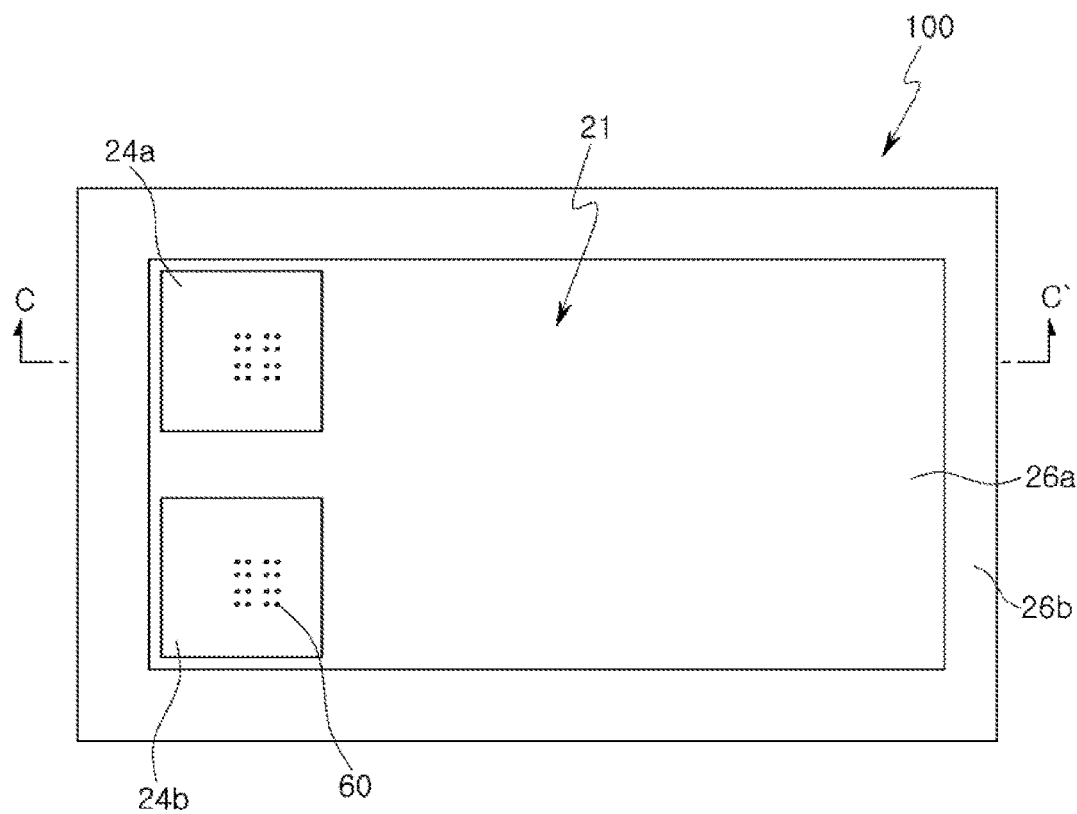
FIG. 5 is a schematic plan view of the crystal oscillator package according to another embodiment in the present disclosure.
Figure 6:
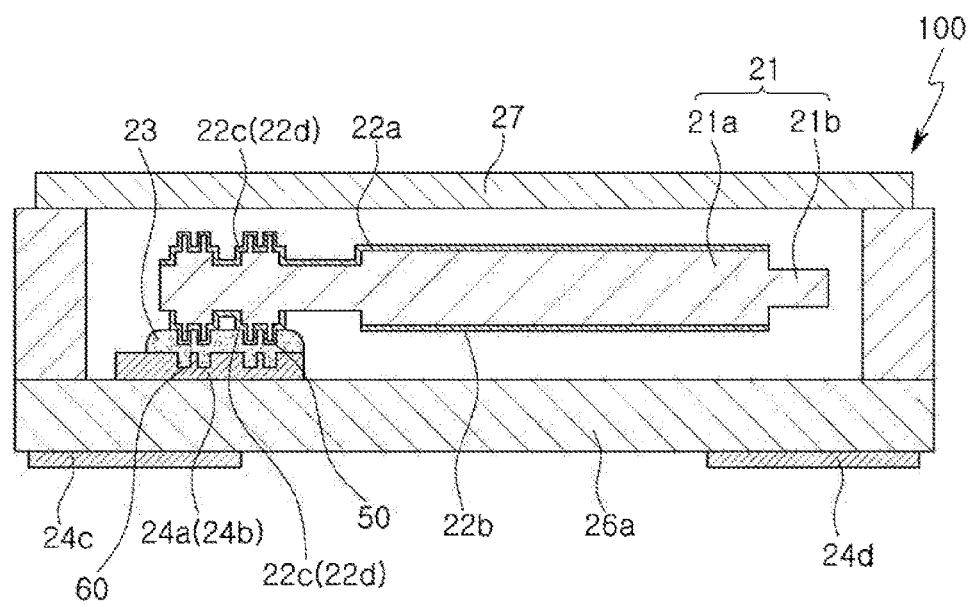
FIG. 6 is a schematic cross-sectional view of a crystal oscillator package according to another embodiment, taken along line C-C' of FIG. 5.

FIG. 5 is a schematic plan view of the crystal oscillator package 200 according to another embodiment. FIG. 6 is a schematic cross-sectional view of a crystal oscillator package 200 taken along line C-C' of FIG. 5. Referring to FIGS. 5 and 6, the crystal oscillator package 200 according to another embodiment further includes groove parts 60 formed in the first and second electrode pads 24a and 24b. The groove parts 60 are formed at positions corresponding to the protrusions 50 of the crystal oscillator package 100. The groove parts 60 may be coupled to the protrusions 50 to physically fix the crystal piece 21 to the base substrate 26a. That is, in the crystal oscillator package 200 according to another embodiment, a contact area may be significantly increased using the protrusions 50, and physical coupling force may be improved by forming the groove parts 60, whereby reliability of the crystal oscillator package may be improved.

For example, although the crystal piece, which is a piezoelectric device, and a package including the same have been described by way of example in the above-mentioned embodiments, the present disclosure is not limited thereto, and may also be applied to a crystal oscillator in which an oscillator circuit element oscillating the crystal oscillator is installed in the package.

As set forth above, the crystal oscillator and the crystal oscillator package including the same according to one or more embodiments may include a plurality of protrusions formed on the end portion of the lower surface of the crystal piece. The protrusions may have the form of two or more stages to increase adhesion, and thus reliability may be improved.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A crystal oscillator package comprising:
   a crystal piece configured to vibrate in response to an electrical signal;
   a first vibrating part protruding from an upper surface of the crystal piece;
   a second vibrating part protruding from a lower surface of the crystal piece;
   a first exciting electrode disposed on the first vibrating part;
   a second exciting electrode disposed on the second vibrating part; and
   protrusions extending from an end portion of the lower surface of the crystal piece,
   wherein the protrusions comprise two or more stages.

2. The crystal oscillator package of claim 1, wherein a height of the protrusions is less than or equal to a height of the first and second vibrating parts.

3. The crystal oscillator package of claim 1, wherein the protrusions are formed by etching the crystal piece.

4. The crystal oscillator package of claim 1, further comprising first and second connection electrodes electrically connected to the first and second exciting electrodes to thereby connect to an external power supply, wherein the first and second connection electrodes are disposed on outer surfaces of the protrusions.

5. The crystal oscillator package of claim 1, wherein the protrusions increase an adhesion area.

6. The crystal oscillator package of claim 1, wherein a height of the protrusions is greater than the height of the first and second vibrating parts.

7. A crystal oscillator package comprising:
a base substrate;
a first electrode pad and second electrode pad disposed on an upper surface of the base substrate;
a crystal piece configured to vibrate in response to an electrical signal, wherein an end portion of the crystal piece is fixedly attached to the first and second electrode pads;
a first vibrating part protruding from an upper surface of the crystal piece;
a second vibrating parts protruding from a lower surface of the crystal piece;
a first exciting electrode disposed on the first vibrating part;
a second exciting electrode disposed on the second vibrating part; and
protrusions extending from an end portion of the lower surface of the crystal piece, wherein the protrusions comprise two or more stages.

8. The crystal oscillator package of claim 7, wherein a conductive adhesive bonds the protrusions to the first and second electrode pads.

9. The crystal oscillator package of claim 7, wherein a height of the protrusions is less than or equal to a height of the first and second vibrating parts.

10. The crystal oscillator package of claim 7, wherein the protrusions are formed by etching the crystal piece.

11. The crystal oscillator package of claim 7, further comprising first and second connection electrodes electrically connected to the first and second exciting electrodes to thereby connect to an external power supply, wherein the first and second connection electrodes are disposed on outer surfaces of the protrusions.

12. The crystal oscillator package of claim 11, wherein a conductive adhesive bonds the first and second connection electrodes to the first and second electrode pads.

13. The crystal oscillator package of claim 11, wherein the protrusions increase an adhesion area between the first and second connection electrodes and the first and second electrode pads.

14. The crystal oscillator package of claim 11, wherein groove parts are disposed in the first and second electrode pads corresponding to the protrusions.

15. The crystal oscillator package of claim 7, further comprising external electrode pads disposed on a lower surface of the base substrate opposite the electrode pads.

* * * * *